(12) United States Patent
Bhalla et al.

(10) Patent No.: US 11,710,662 B2
(45) Date of Patent: Jul. 25, 2023

(54) REUSABLE WIDE BANDGAP SEMICONDUCTOR SUBSTRATE

(71) Applicant: United Silicon Carbide, Inc., Monmouth Junction, NJ (US)

(72) Inventors: Anup Bhalla, Princeton Junction, NJ (US); Leonid Fursin, Monmouth Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 274 days.

(21) Appl. No.: 17/029,699

(22) Filed: Sep. 23, 2020

(65) Prior Publication Data

US 2021/0005517 A1 Jan. 7, 2021

Related U.S. Application Data (62) Division of application No. 16/170,622, filed on Oct. 25, 2018, now Pat. No. 10,825,733.

(51) Int. Cl.
*H01L 29/06* (2006.01)
*H01L 21/78* (2006.01)
*H01L 23/00* (2006.01)

(52) U.S. Cl.
CPC .......... *H01L 21/7813* (2013.01); *H01L 24/98* (2013.01); *H01L 2924/1033* (2013.01); *H01L 2924/10254* (2013.01); *H01L 2924/10272* (2013.01); *H01L 2924/10323* (2013.01); *H01L 2924/10325* (2013.01)

(58) Field of Classification Search
CPC ........ H01L 21/28; H01L 21/04; H01L 21/304
See application file for complete search history.

(56) References Cited

U.S. PATENT DOCUMENTS

| 8,962,468 | B1 | 2/2015 | Hostetler |
| 9,620,415 | B2 | 4/2017 | Hirata et al. |
| 9,868,177 | B2 | 1/2018 | Hirata |

(Continued)

OTHER PUBLICATIONS

Non-Final Office Action for U.S. Appl. No. 16/170,622, dated Feb. 14, 2020, 12 pages.

(Continued)

*Primary Examiner* — Fernando L Toledo
*Assistant Examiner* — Valerie N Newton
(74) *Attorney, Agent, or Firm* — Withrow & Terranova, P.L.L.C.

(57) ABSTRACT

Multiple wide bandgap semiconductor wafers, each having active circuitry and an epitaxially formed backside drain contact layer, may be constructed from a single bulk semiconductor substrate by: forming foundational layers on the top of the bulk substrate via epitaxy; forming active circuitry atop the foundational layers; laser treating the backside of the bulk substrate to create a cleave line in one of the foundational layers; and exfoliating a semiconductor wafer from the bulk substrate, where the exfoliated semiconductor wafer contains the active circuits and at least a portion of the foundational layers. Wafers containing the foundational layers without complete active devices may be produced in a similar manner. The foundational layers may comprise a drain contact layer and a drift layer, and may additionally include a buffer layer between the drain contact layer and the drift layer.

18 Claims, 7 Drawing Sheets

(56) References Cited

U.S. PATENT DOCUMENTS

| | | |
|---|---|---|
| 9,878,397 B2 | 1/2018 | Hirata et al. |
| 2011/0151649 A1* | 6/2011 | Cooper ............... H01L 29/7395 |
| | | 257/E21.09 |
| 2014/0021590 A1 | 1/2014 | Schulze et al. |
| 2014/0361349 A1 | 12/2014 | Alexandrov et al. |
| 2015/0333169 A1 | 11/2015 | Willmeroth et al. |
| 2018/0040689 A1 | 2/2018 | Vecino Vazquez et al. |
| 2020/0135565 A1 | 4/2020 | Bhalla et al. |

OTHER PUBLICATIONS

Applicant-Initiated Interview Summary for U.S. Appl. No. 16/170,622, dated May 15, 2020, 3 pages.

Notice of Allowance for U.S. Appl. No. 16/170,622, dated Aug. 20, 2020, 7 pages.

* cited by examiner

REUSABLE WIDE BANDGAP SEMICONDUCTOR SUBSTRATE

CROSS REFERENCE TO RELATED APPLICATIONS

This application is a divisional of U.S. patent application Ser. No. 16/170,622 filed Oct. 25, 2018 entitled "Reusable Wide Bandgap Semiconductor Substrate," the disclosure of which is hereby incorporated by reference in its entirety.

BACKGROUND

This disclosure is related to wide bandgap semiconductor devices, e.g., silicon carbide (SiC) vertical power devices.

SUMMARY

Multiple wide bandgap semiconductor wafers having active circuitry and epitaxially formed backside drain contact layers may be constructed from a single bulk semiconductor substrate. This may be achieved, for example, by (a) forming foundational layers on the top of a bulk substrate via epitaxy, (b) forming active circuitry atop the foundational layers, (c) laser treating the backside of the bulk substrate to create a cleave line in one of the foundational layers, and (d) exfoliating a semiconductor wafer from the bulk substrate, where the exfoliated semiconductor wafer contains the active circuits and at least a portion of the foundational layers. Similarly, wafers containing the foundational layers may be produced in this manner, whereby active circuitry may be added later.

The foundational layers may comprise a drain contact layer and a drift layer, and may additionally include a drain buffer layer between the drain contact layer and the drift layer. Active circuitry may be formed, e.g., by etching trenches into the drift region and adding source and gate regions, etc., to form diodes, transistors, thyristors, IGBTs, and the like, having vertical or horizontal active junctions, or combinations of vertical and horizontal active junctions. For simplicity we will refer to the backside contact layer as "drain contact layer", although this layer may normally be called a "cathode layer" or "collector layer" for different device types.

After exfoliation of a wafer, the bulk substrate may be ground or etched to prepare the bulk substrate for reuse. The bulk substrate may be made of a the wide-bandgap semiconductor material such as silicon carbide (SiC), gallium nitride (GaN), aluminum nitride (AlN), boron nitride (BN), diamond, or gallium oxide, for example.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE FIGURES

A more detailed understanding may be had from the following Detailed Description, given by way of example in conjunction with the accompanying figures. The figures are not necessarily drawn to scale. Analogous items in the various figures are generally labelled with the same reference designators.

FIG. 1 shows an example starting bulk substrate and the addition of drain contact and drain buffer layers.

FIG. 2 shows an example of the addition of a drift layer and active circuitry elements, and the attachment of a carrier using an adhesive.

FIG. 3 shows an example of the division of the layers into an active circuit wafer and a bulk substrate for reuse.

FIG. 4 shows an example of the active circuit wafer with the additions of a backside metallization and dicing tape.

FIG. 5 shows an example of the active circuit wafer ready for dicing, and also of the bulk substrate ready for reuse.

DETAILED DESCRIPTION

Multiple wide bandgap semiconductor wafers having active circuitry and epitaxially formed backside drain contact layers may be constructed from a single bulk semiconductor substrate. This may be achieved, for example, by (a) forming foundational layers on the top of a bulk substrate via epitaxy, (b) forming active circuitry atop the foundational layers, (c) laser treating the backside of the bulk substrate to create a cleave line in one of the foundational layers, and (d) exfoliating a semiconductor wafer from the bulk substrate, where the exfoliated semiconductor wafer contains the active circuits and at least a portion of the foundational layers. Similarly, wafers containing the foundational layers may be produced in this manner, whereby active circuitry may be added later.

The foundational layers may comprise a drain contact layer and a drift layer, and may additionally include a drain buffer layer between the drain contact layer and the drift layer. Active circuitry may be formed, e.g., by etching trenches into the drift layer and adding source and gate regions, etc., to form diodes, transistors, thyristors, and the like, having vertical or horizontal active junctions, or combinations of vertical and horizontal active junctions.

After exfoliation of a wafer, the bulk substrate may be ground or etched to prepare the bulk substrate for reuse. The bulk substrate may be made of a wide-bandgap semiconductor material having a bandgap of 2.0 eV or greater, such as silicon carbide, gallium nitride, aluminum nitride, boron nitride, diamond, or gallium oxide, for example.

The processes and devices described herein offer several advantages over conventional wafer processing techniques and wide bandgap devices. A first example advantage is that thinner finished devices may be produced using the processes described herein, yet most of the processing steps may be performed on the thick bulk substrate. Processing on a thicker substrate may result in less risk of wafer cracking prior to final device separation, for example, as well as flatness and rigidity of the work piece in process.

Further, thinner devices exhibit lower thermal and electrical resistance, and hence better operational performance for power devices. For example, finished devices that are only 19 to 22 μm (micron) thick may be created, with the topside metals and dielectrics accounting for 5 to 10 μm of thickness, and a substantial ohmic drain contact layer of, e.g., 12 μm. This thinness mean substantially eliminating any substrate resistance contribution to the finished device resistance. This allows cost reduction by shrinking the chip size for a target on-resistance. In other words, active devices may be created which are both vertically thinner, and smaller in horizontal area, while preserving performance characteristics. Alternatively, the technique described herein may allow economically creating smaller devices for use in lower standoff voltage ranges than are conventional for wide band gap materials, e.g., below 650V for SiC.

A second example advantage is the formation of better backside drain contacts at lower cost by eliminating ion implantation step. Normally, backside contacts cannot be formed by epitaxy due to the potential to damage topside active devices, due to the oven temperatures necessary for epitaxy. Using the techniques described herein, the layers that end up acting as the drain contact and drain buffer may be formed first, so that the later-formed active circuit elements are not at risk. Further, via epitaxy, higher dopant activation levels may be economically achieved in the backside drain contact layer, versus dopant activation levels that may be achieved by conventional implantation and thermal activation anneal process.

A third example advantage is that the use of an epitaxially grown drift region may obviate the need for controlling doping of the starting bulk semiconductor substrate. The bulk substrate may be formed out of intrinsic silicon carbide or other wide bandgap material, without the need to control its doping level, for example.

Via epitaxy, a backside drain contact layer may be formed in a wide range of doping concentrations, for example, in the range of 2.00e19 to 5.00e19/$cm^3$, or more generally 1.00e19 to 2.00e20/$cm^3$. Further, via epitaxy, dopant activation rates of 60%, or even 95% or higher, may be achieved easily. Depending on the doping species, activation may be 96%, 97%, 98%, 99%, or more. Epitaxy can also provide a remarkably uniform doping level throughout the entire thickness of the drain contact layer, such as less than +/−5% deviation from the average value. Even after subsequent processing, activation of 95% or more be found within at least 80% of the drain contact layer thickness.

Similarly, a wide range of doping levels and high activation levels are available for layers above the drain contact layer, for example, a drain buffer layer, in addition to the drift layer. For example, a drain buffer layer above the drain contact layer may have a doping level in a range of 1e17 to 1e19/$cm^3$, or more generally from 1e16 to 1e19/$cm^3$. Again, the dopant activation level of such a layer may be higher than 60%, or even 95-99% or more, throughout at least 80% of the thicknesses of drain buffer layer and drift layer, for example.

The doping and the thickness of a drain buffer region may be selected so that the drain buffer region serves to convert most of basal plane defects to threading screw dislocations, to relax wafer stress, to improve diode recovery softness profiles, to increase robustness to radiation induced damage, or to provide a combination of such benefits.

A wide range of device thicknesses and standoff voltages may be produced using the processes described herein. For example, finished devices with vertical thicknesses in the range of 15 and 35 μm, or more generally 10 to 120 μm, may be exfoliated from a bulk substrate with a much higher initial thickness, e.g., 350 μm or more. By adjustment of the thickness of the drift layer, for example, a wide range of standoff voltage may be achieved with these materials and methods described herein, for example, from 300 to 3,300 volts, or more generally from 50 to 10,000 volts or more.

A wide range of active devices may be produced using the techniques described herein, such as vertical devices, horizontal devices, and hybrid devices with vertical and horizontal features. Such devices may include diodes, MOSFETs, JFETs, BJTs, thyristors, IGBTs, and combinations thereof, for example.

In addition to making wafers that include completed active semiconductor devices, the methods herein may be used to construct exfoliated substrates with epitaxially grown drain contact and drain buffer layers, where active devices may be added later to the exfoliated substrates.

FIGS. 1-5 show vertical cross sections of semiconductor material at various steps in an example process for creating wafers and individual semiconductor devices.

Figure 1:
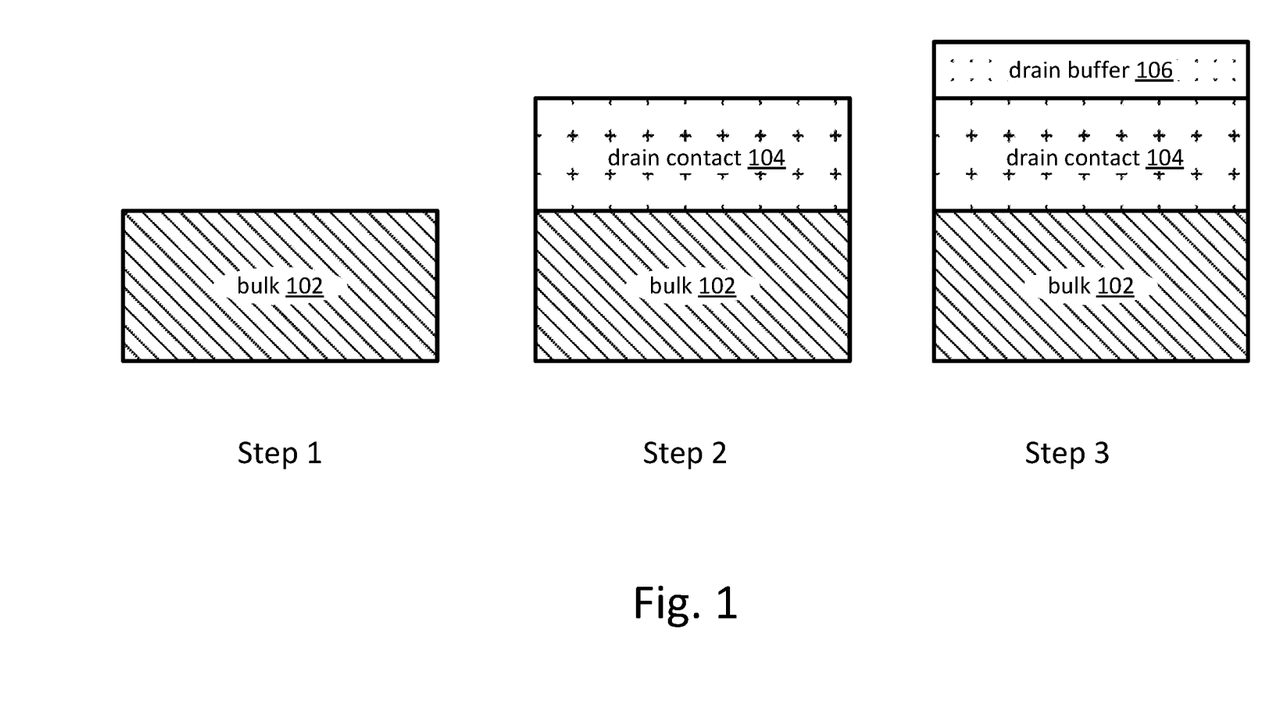
FIGS. 1-5 illustrate vertical cross sections of semiconductor structures in an example wafer process for using and reusing a bulk substrate.

Step 1 of FIG. 1 shows the starting material, bulk 102. The bulk substrate 102 may be made of a wide-bandgap semiconductor material, for example, a material with a bandgap of 2.0 eV or greater, such as silicon carbide, gallium nitride, aluminum nitride, boron nitride, diamond, or gallium oxide. The bulk 102 may be wafer sawn from a slug of single crystalline silicon carbide, for example. The bulk 102 may be much thicker than the target size of the finished product. For example, the bulk 102 may be more than 350 μm thick, while finished devices may be only 25 μm thick.

In Step 2 of FIG. 1, a drain contact layer 104 may be added, for example, via epitaxy. The drain contact 104 may be placed on the top of the bulk 102, and may be doped in the range of 2.00e19 to 5.00e19/$cm^3$, or more generally 1.00e19 to 2.00e20/$cm^3$. The dopants of the drain contact layer may be highly activated from, for example, 60% to nearly 100% activated. The drain contact 104 layer may be initially constructed thicker than intended for use in a finished device. For example, for a finished thickness of 1 to 30 μm, or perhaps 10 to 20 μm, the drain contact layer may initially be grown to a thickness of 40 or 50 μm, to allow for losses in later processing. In practice, the drain contact layer 104 may include various sublayers that have varying doping levels.

In Step 3 of FIG. 1, a drain buffer layer 106 may be added. The drain buffer layer 106 may have a doping level in the range of 1e17 to 1e19/$cm^3$, or more generally 1e16 to 1e19/$cm^3$, and a dopant activation level from 60% to nearly 100%, for example, 95% or higher. For example, the doping level of the drain buffer region 106 may be from two to one hundred times higher than the doping of the drift region.

In practice, the drain buffer layer 106 may be omitted in the construction of many vertical power devices. However, inclusion of the drain buffer 106 may help in converting basal plane defects to threading screw dislocations, relaxing wafer stress, improving diode recovery softness profiles, and/or increasing robustness to radiation induced damage. In practice, the drain buffer 106 may comprise various sublayers that have varying doping levels.

The drain buffer 106 may vary considerably in thickness, depending on design needs, for example, from 1 to 10 μm, or more generally 0.1 to 30 μm. For example, a drain buffer thickness of 3 μm may be used for devices with a 1200 V standoff rating.

Figure 2:
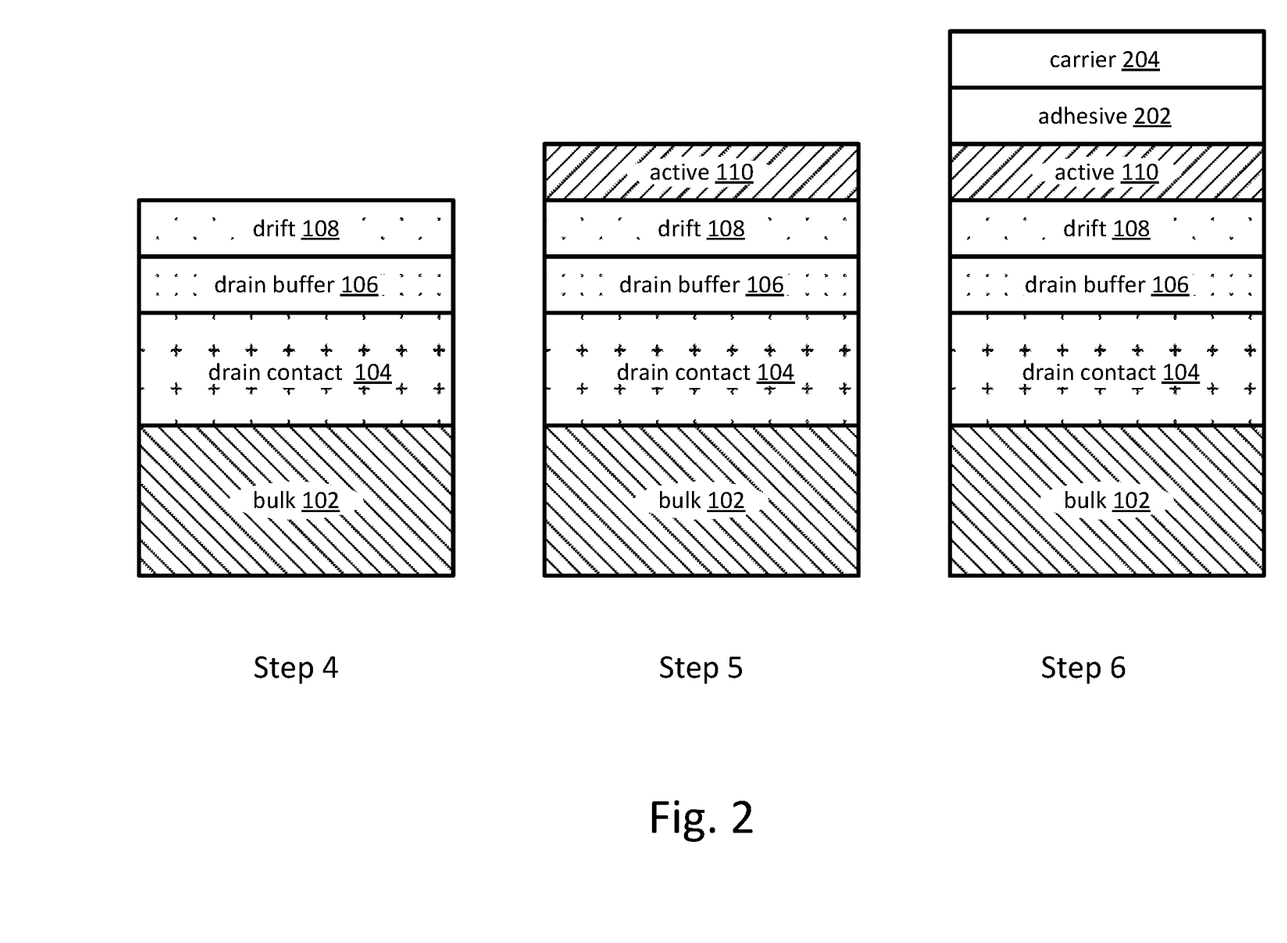

In Step 4 of FIG. 2, a drift layer 108 may be added atop the drain buffer 106. In practice, this layer may be doped at any level, depending on the requirements of particular active devices, or may be left intrinsic with no doping.

In Step 5 of FIG. 2, an active circuit layer 110 may be added atop the drift 108. Any commonly understood techniques may be employed in this step, including, for example, etching, implanting, deposition, and growth of semiconductors, polysilicons, oxides, nitrides, other dielectrics, and metals. For example, elements of vertical semiconductor devices may be added via the etching trenches and epitaxial growth of source regions in the active circuit layer 110. Similarly, the active circuit layer 110 may include semiconductor elements that, alone or in combination with one or more of the drift 108, drain buffer 106, and drain contact 104, form diodes, JFETs, MOSFETs, BJTs, IGBTs, or thyristors, or combinations of thereof, or other devices.

In Step 6 of FIG. 2, a carrier 204 may be added atop the active circuit layer 110. Attaching the carrier 204 to the top of the wafer facilitates access to the backside of the bulk 102. In this example, the carrier 204 may be affixed via an adhesive 202. Typically, the carrier 204 comprises silicon, sapphire, or glass, and the adhesive 202 comprises a separate material. Alternatively, the carrier 204 and the adhesive 202 may comprise two portions of a single carrier material that may be applied to grip the top of the assembly.

Figure 3:
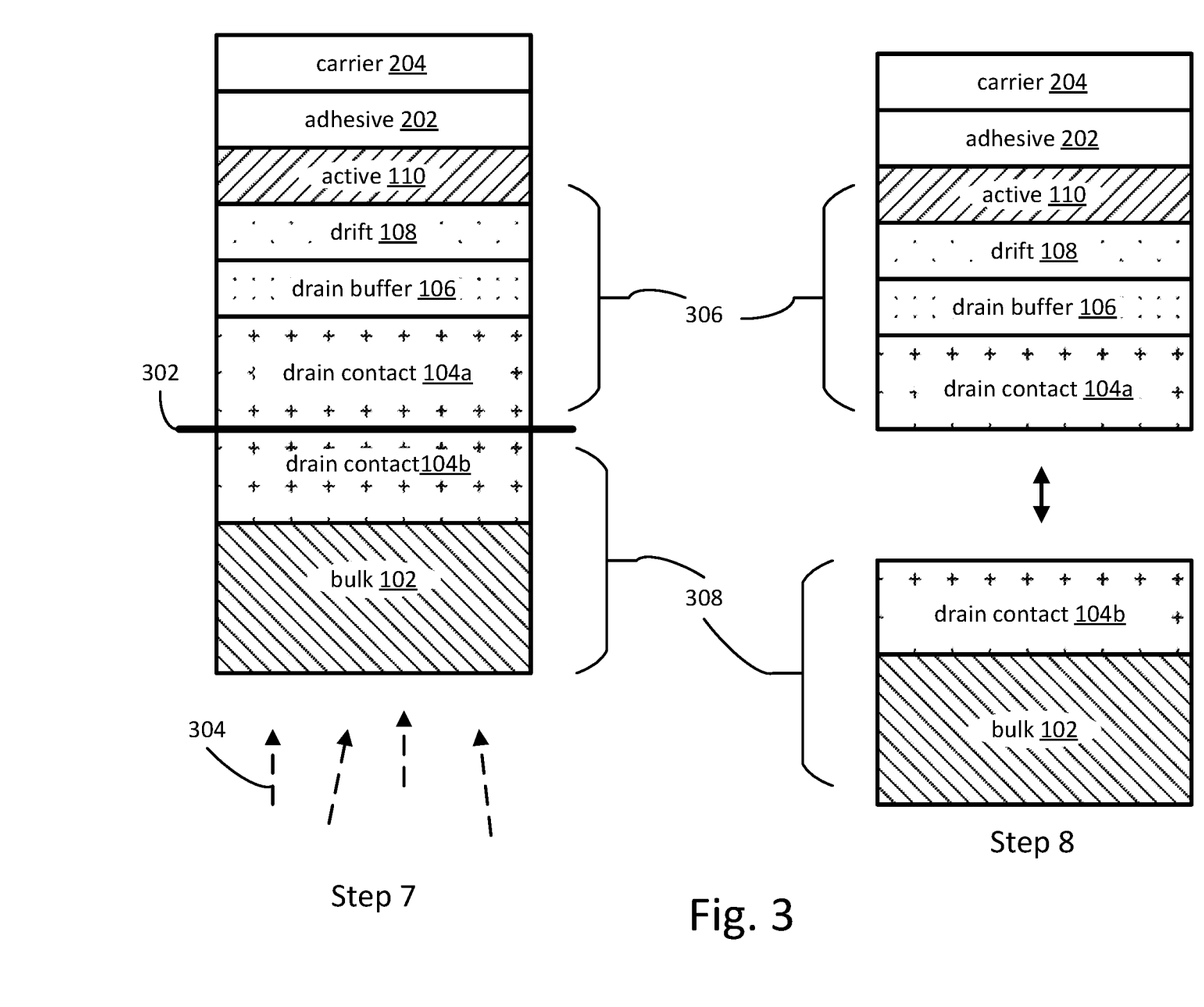

In Step 7 of FIG. 3, a cleave line 302 may be introduced at a controlled depth in the drain contact layer 104. The cleave line 302 may be created by applying laser energy 304 from the backside of the bulk 102 that penetrates into the drain contact layer 104. The cleave line 302 may be achieved, for example, using the DISCO Corporation KABRA process. See, e.g.: U.S. Pat. No. 9,620,415 (Hirata, et al.) "Wafer processing method," granted Apr. 11, 2017; U.S. Pat. No. 9,878,397 (Hirata, et al.) "SiC wafer processing method," granted Jan. 30, 2018; and U.S. Pat. No. 9,868,177 (Hirata) "Wafer producing method," granted Jan. 16, 2018. The laser energy 304 may create a localized damage zone in a highly focused plane within the drain contact layer 104.

The cleave line 302 may divide the assembly into two portions. The top portion 306 may comprise an upper portion 104b of the drain contact 104, as well as the drain buffer 106, drift 108, and active layer 110. The bottom portion 308 of the assembly may comprise a lower portion 104b of the drain contact 104 and the bulk 102.

In Step 8 of FIG. 3, the top portion 306 may be exfoliated along the cleave line 302 to become a semiconductor wafer separate from the bulk substrate 102. The thin exfoliated top portion 306 may be supported by the carrier 204. In practice, the bottom portion 308 may also be supported by another carrier, not shown, which may be applied to the back side of the bulk 102.

Using the KABRA process, for example, the cleave line 302 may generally be placed with a +/−3 μm accuracy. After exfoliation thickness measurements may be performed on the top portion 306, bottom portion 308, or both, to ensure appropriate placement of the cleave line 302. It may be important, when targeting the placement of the cleave line 302 to account for variations in thickness of the substrate bulk 102, since the thickness of the bulk 102 may change as it is reused, and to verify that proper placement has been achieved. The position of the cleave line 302 may be determined with reference to either the top surface of the top portion 306, or with reference to the backside plane of the bulk 102, for example, where the bulk 102 contacts a vacuum chuck in the laser tool when using the KABRA process.

Figure 4:
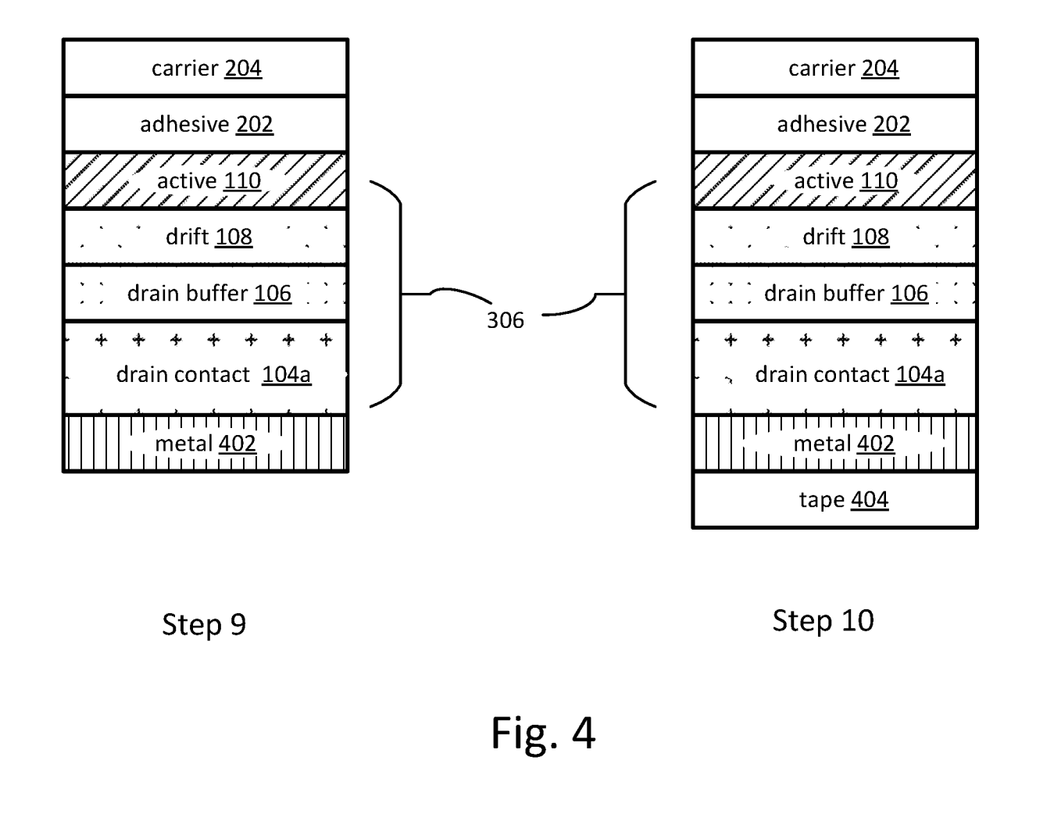

In Step 9 of FIG. 4, a drain contact metallization 402 may be added to the backside drain contact 104a of the exfoliated wafer 306. The exfoliated wafer 306 may be supported by the carrier 204 for this operation.

Not shown in FIG. 4, prior to adding metallization 402, the drain contact 104a may be treated in number of ways. For example, the drain contact 104a may be polished, etched, or both, in order to smooth or thin the exposed surface of the drain contact 104a. For example, the drain contact layer 104 may be initially grown to be 20 μm thick, and then split into two equal portions 104a and 104b of 10 μm each. After exfoliation, the portion remaining on the exfoliated wafer 306 may be ground or etched even thinner, resulting in a final contact buffer thickness of 3.5 μm to 5 μm, for example. Other thicknesses may be used, for example, even 1 μm or less. The exfoliated top portion 306 may be supported by the carrier 204 for such operations.

Similarly, prior to adding the backside metallization 402, the drain contact 104a may be implanted, and then treated with a laser to activate the implanted dopants. Additionally or alternatively, the drain contact 104a may be treated with a laser to create a graphitic region for ohmic bonding to the backside metallization 402. See, e.g., U.S. Pat. No. 8,962,468 (Hostetler) "Formation of ohmic contacts on wide band gap semiconductors," issued Feb. 24, 2015. The exfoliated top portion 306 may be supported by the carrier 204 for such operations. Alternatively, implantations and laser treatments may be omitted at this stage, instead relying on heavy doping of the drain contact layer 104 during epitaxial formation.

In Step 10 of FIG. 4, a dicing tape 404 or other backing may be added to the backside of the exfoliated wafer 306.

Figure 5:
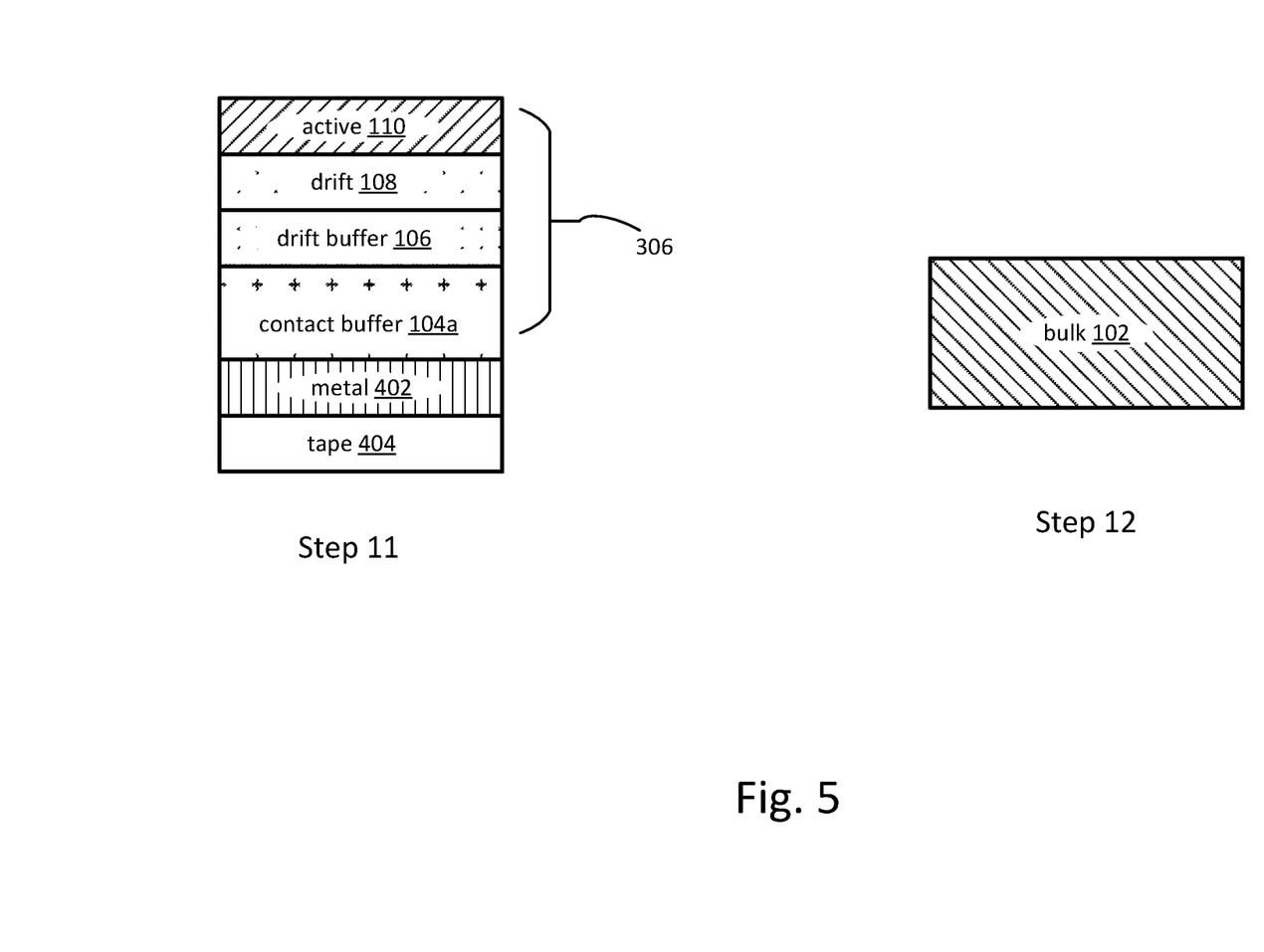

In Step 11 of FIG. 5, the exfoliated wafer 306 is shown with the topside carrier 204 and adhesive 202 removed. The exfoliated wafer 306 may now be diced into individual electronic devices, and the individual die may then be removed from the dicing tape 404.

In Step 12 of FIG. 5, the bulk substrate 102 is shown again ready for use. In practice, the bulk 102 may be reused while having a portion 104b of the drain contact 104 still affixed, for example, as shown as the bottom portion 308 in Step 8 of FIG. 3. For example, the drain contact portion 104b may be smoothed by grinding, etching, or both before steps 1-8 of FIGS. 1-3 are repeated.

Alternatively, as illustrated in the example of Step 12 of FIG. 5, the remnants of the drain contact layer 104b may be entirely removed from the bulk substrate 102 in Step 12, for example, via grinding, etching, or both, to provide certainty in the surface condition of the top side of the starting material bulk 102. In either case, the bulk material 102 may be ready for reuse in Steps 1-11

Figure 6A:
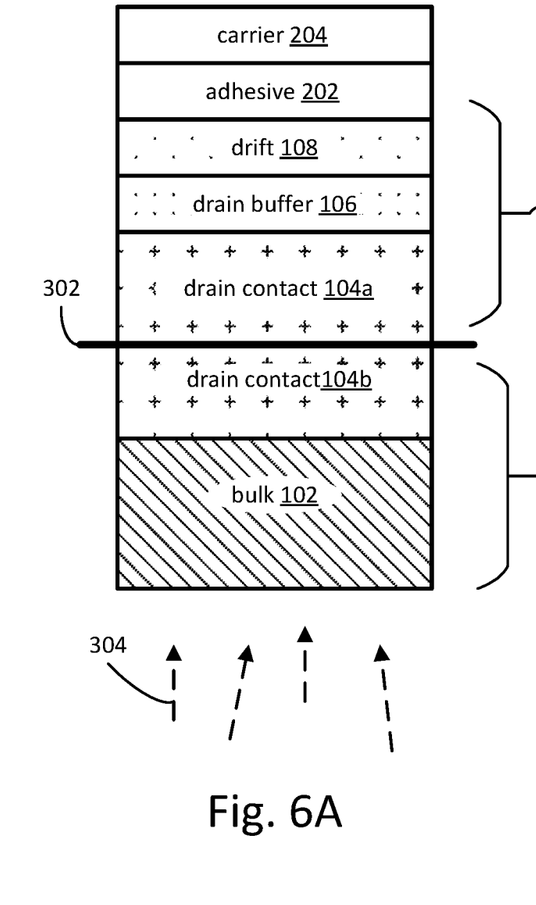
FIGS. 6A and 6B show vertical cross sections of an example a wafer in an example method of creating multiple semiconductor wafers from one bulk substrate, where the semiconductor wafers do not have completed active circuitry.

FIG. 6A illustrates using the techniques described herein to create exfoliated wafers that include epitaxially formed drain contact layers, where the exfoliated wafers may be used to later create completed active semiconductor devices. FIG. 6A is similar to the vertical cross section shown for Step 7 of FIG. 3. Here in FIG. 6A, however, the top portion to be exfoliated 606 does not have an active circuit layer 110. In the example of FIG. 6A, the carrier 204 may be affixed via adhesive 202 directly to the drift layer 108.

As in the example FIG. 3, here in FIG. 6A the drift 108 sits atop a drain buffer 106, which in turn rests on a portion of a drain contact layer 104a. A cleave line 302 separates the upper portion of the drain contact layer 104a from a lower portion 104b. The lower portion of the drain contact layer is atop the bulk 102.

Figure 6B:
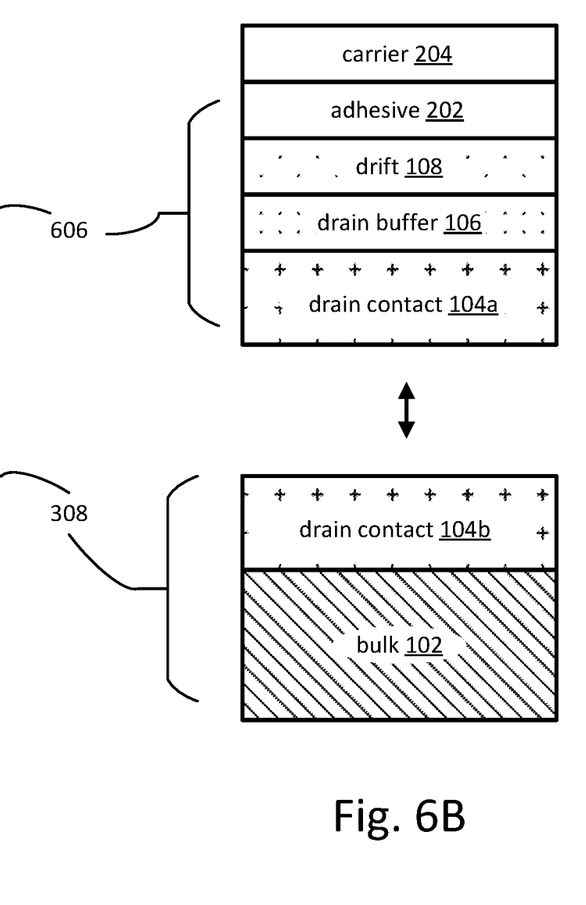

In FIG. 6B, the upper portion 606 may be exfoliated from the bulk substrate remnant 308. Not shown in FIG. 6B, the substrate remnant 308 may be cleaned and reused to make another exfoliated upper portion 606. As described in connection with Step 9 of FIG. 4, metallization 402 may be added to the drain contact region 104a, for example, after optional grinding, implants, and laser treatments.

Figure 7:
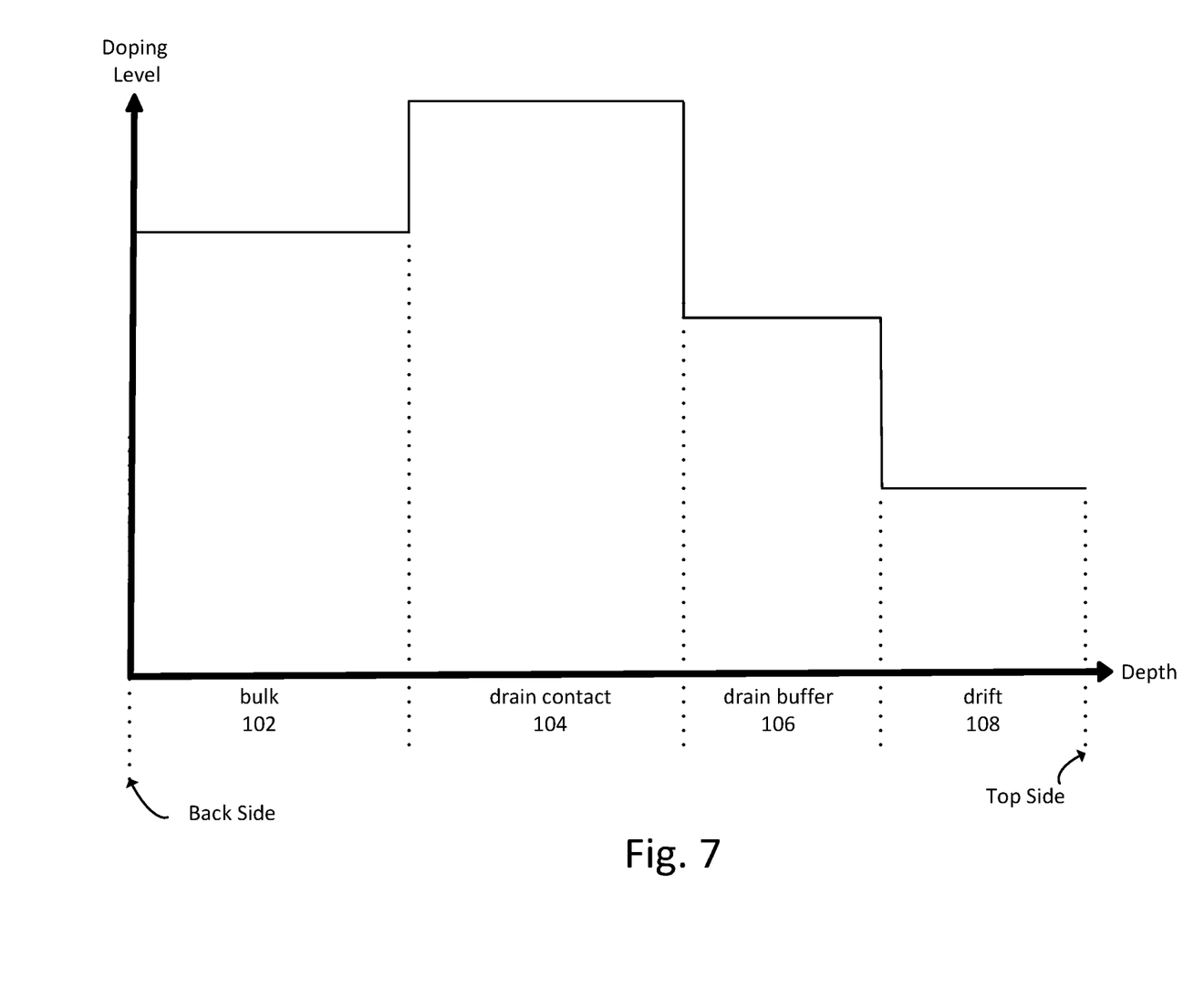
FIG. 7 shows an example doping profile of a reusable substrate with epitaxially formed drain buffer and drain contact regions.

FIG. 7 shows an example doping profile of a reusable substrate including a bulk 102, drain contact layer 104, drain buffer layer 106, and drift layer 108, for example, as illustrated in Step 4 of FIG. 2. As with all drawings herein, the depths may not be to scale, nor may be the doping levels, or the transitions from one doping level to another. As compared to the illustration of Step 4 in FIG. 2, here in FIG. 7 the wafer is rotated clockwise ninety degrees, such that the depth of the wafer is on the x-axis, with the backside of the wafer being on the left and the top side of the wafer being on the right. The relative doping levels of various layers are shown on the Y-axis of FIG. 7.

The bulk 102 may be at any doping level, or left undoped/intrinsic. Since the bulk only serves as a template for epitaxial growth, its exact doping level is not critical. However, the doping level of the bulk 102 may be selected to minimize defects, especially dislocations and basal plane defects in epitaxial layers, or to provide good wafer flatness.

The drain contact region 104 may be heavily doped, for example, in the range of 1e19 to 1e20/cm$^3$, to facilitate easy ohmic contact formation after cleaving, without any need for enrichment implants or laser treatment. The drain contact doping level may be designed to be higher than is traditional for SiC substrates, for example, with bulk resistivity of 15-25 milliohm-cm. In practice, the drain contact layer 104 may comprise various sublayers that have varying doping levels.

The example doping profile of FIG. 7 includes a drain buffer layer 106. While the drain contact region 104 by itself may serve as a drain beneath a drift region, the inclusion of at least one separate drain buffer region 106 may provide a number of advantages. For example, the doping of the drain buffer region 106 may be selected at a lower level than the doping of the drain contact layer 104 so that the drain buffer 106 acts as a buffer layer to: convert basal plane defects to threading screw dislocations; relax wafer stress; improve diode recovery softness profiles; or increase robustness to radiation induced damage; or any combination thereof. In practice, the drain buffer layer 106 may comprise various sublayers that have varying doping levels.

Shown to the right in FIG. 7, at the top of the wafer, is the drift layer 108. The drift layer 108 may have a lower doping concentration than either the drain contact layer 104 or drain buffer layer 106. As required for the particular active devices to be constructed on the wafer, the drift 108 may be doped with either doping type or left undoped. In the example of FIG. 7, the drift region 108 comprises a single doping level. In practice, a combination of layers could be grown, for example, a drift layer and a current spreading layer.

Not shown in FIG. 7, other layers may be grown above the drift layer 108, such as channel and source regions for diodes, JFETs, and MOSFETs. Epitaxial growth, etching, deposition, and/or implantation operations, for example, may be used in constructing the final layers of active device components and circuitry above the substrate depicted in FIG. 7.

The depth dimensions of FIG. 7 are not to scale, with the various layers having similar thicknesses. In practice, the thicknesses may be dramatically different from one layer to another. For example, a 1200V SiC device may be constructed on a starting bulk substrate 102 that is 350 μm (micron) thick. For a final device thickness of about 25 μm, a 12 μm n+ drain contact layer 104 may be grown with a doping level in the range of 1e19 to 5e19/cm$^3$. On top of the drain contact 104, a 3 μm drain buffer layer 104 may be grown with a doping level in the range of 2e17 to 2e18/cm$^3$, for example to compensate for, or reduce, defects in subsequent layers. Above the drain buffer 106, a 2 to 15 μm drift may be grown with a doping level in the range of 1e15 to 5e16/cm$^3$.

The substrate as shown in FIG. 7 may be divided by the creation of a cleave line through the drain contact layer 104. This may be done before or after the addition of further active circuitry layers in or above the drift 108. Further this may be done with or without including a drain buffer layer.

The processes and devices described herein, and as recited in the claim, may or may not exhibit all of the stated advantages.

We claim:

1. A method of forming a semiconductor wafer, comprising:
   forming an assembly, which includes epitaxially forming, atop a bulk semiconductor substrate, a set of foundation layers, wherein:
   the set of foundation layers comprises a drain contact layer atop the bulk semiconductor substrate, and a drift layer atop the drain contact layer;
   each layer of the set of foundation layers comprises a wide bandgap semiconductor material, the wide-bandgap semiconductor material having a bandgap equal to or greater than 2.0 eV;
   the drain contact layer has a minimum doping level of 1e19/cm3; and
   the drain contact layer has a dopant activation level higher than 95% within at least 80% of a total thickness of the drain contact layer;
   creating a cleave line, across the width of the bulk semiconductor substrate and at a controlled depth in the drain contact layer, by applying laser energy to a bottom of the bulk semiconductor substrate, wherein:
   the assembly is divided into a top portion and a bottom portion; and
   the top portion comprises at least the drift layer, and an upper portion of the drain contact layer, while the bottom portion comprises a lower portion of the drain contact layer and the intact bulk semiconductor substrate; and
   exfoliating the top portion along the cleave line.

2. The method of claim 1, further comprising, repeating the steps of claim 1 to form one or more additional top portions from the bulk semiconductor substrate.

3. The method of claim 1, wherein:
   the set of foundation layers further comprises a drain buffer layer, the drain buffer layer being between the drain contact layer and the drift layer, such that the top portion from the bulk semiconductor substrate further includes the drain buffer layer;
   the drain buffer layer has a doping level in a range from 1e16/cm3 to 1e19/cm3; and
   the drain buffer layer has a dopant activation level higher than 95%.

4. The method of claim 3, further comprising, repeating the steps of claim 1 to form one or more additional top portions from the bulk semiconductor substrate.

5. The method of claim 4, further comprising, adjusting the laser energy for each additional top portion according to a thickness of the bulk semiconductor substrate.

6. The method of claim 3 herein forming the assembly further includes forming one or more active circuitry layers atop the set of foundation layers, wherein the one or more active circuitry layers alone or in combination with the set of foundation layers form at least one active semiconductor devices.

7. The method of claim 6, wherein the wide bandgap semiconductor material is silicon carbide, gallium nitride, aluminum nitride, boron nitride, diamond, or gallium oxide.

8. The method of claim 7, wherein the at least one active semiconductor device has a standoff voltage between 30 and 3300 volts.

9. The method of claim 8, wherein the at least one active semiconductor device has a thickness from 10 to 120 μm.

10. The method of claim 8, wherein the at least one active semiconductor device has a thickness from 15 to 35 μm.

11. The method of claim 9, wherein the active doping level of the drain contact layer is in a range from 2e19 to 5e19/cm3.

12. The method of claim 6, wherein the at least one active semiconductor device has a standoff voltage between 50 and 10000 volts.

13. The method of claim 6, wherein the at least one active semiconductor device comprises at least one of a vertical junction-gate field-effect transistor (JFET), a horizontal JFET, a hybrid vertical and horizontal JFET, a diode, a bipolar junction transistor (BJT), and a metal—oxide—semiconductor field-effect transistor (MOSFET).

14. The method of claim 3, wherein the semiconductor wafer has a standoff voltage between 50 and 10000 volts.

15. The method of claim 3, wherein the semiconductor wafer has a standoff voltage between 30 and 3300 volts.

16. The method of claim 3, wherein the semiconductor wafer has a thickness from 10 to 120 μm.

17. The method of claim 16, wherein the semiconductor wafer has a thickness from 15 to 35 μm.

18. The method of claim 17, wherein the active doping level of the drain contact layer is in a range from 2e19 to 5e19/cm3.

* * * * *

UNITED STATES PATENT AND TRADEMARK OFFICE
CERTIFICATE OF CORRECTION

PATENT NO. : 11,710,662 B2
APPLICATION NO. : 17/029699
DATED : July 25, 2023
INVENTOR(S) : Anup Bhalla and Leonid Fursin It is certified that error appears in the above-identified patent and that said Letters Patent is hereby corrected as shown below:

In the Claims

In Column 8, Line 67, replace "devices." with --device.--

Signed and Sealed this
Twenty-ninth Day of August, 2023

Katherine Kelly Vidal
*Director of the United States Patent and Trademark Office*